United States Patent [19]

McLaughlin et al.

[11] Patent Number: 5,303,402
[45] Date of Patent: Apr. 12, 1994

[54] ELECTRICALLY ISOLATED METAL MASK PROGRAMMING USING A POLYSILICON FUSE

[75] Inventors: Kevin McLaughlin, Lake Worth; Barry Herold, Boca Raton, both of Fla.

[73] Assignee: Motorola, Inc., Schaumburg, Ill.

[21] Appl. No.: 848,559

[22] Filed: Mar. 9, 1992

[51] Int. Cl.$^5$ .................. H01H 85/04; H01H 37/76
[52] U.S. Cl. ..................... 455/186.1; 455/343; 257/529; 337/297; 307/202.1; 340/825.84
[58] Field of Search .................. 257/209, 529; 307/202.1, 465, 465.1; 365/120; 340/825.84, 825.9, 825.91, 825.44; 455/186.1, 185.1, 343, 334, 127, 67.1; 337/297, 183, 404

[56] References Cited

U.S. PATENT DOCUMENTS

| | | | |
|---|---|---|---|
| 3,763,454 | 10/1973 | Zandonatti | 337/404 |
| 4,210,875 | 7/1980 | Beasom | 257/529 |
| 4,272,753 | 6/1981 | Nicolay | 337/297 |
| 4,426,658 | 1/1984 | Gontowski, Jr. | 257/529 |
| 4,984,054 | 1/1991 | Yamada et al. | 257/529 |
| 5,025,298 | 6/1991 | Fay et al. | 257/529 |
| 5,041,897 | 8/1991 | Machida et al. | 257/529 |
| 5,086,331 | 2/1992 | Hartgring et al. | 257/529 |

Primary Examiner—Reinhard J. Eisenzopf
Assistant Examiner—Lisa Charouel
Attorney, Agent, or Firm—Gregg E. Rasor; Thomas G. Berry; Daniel R. Collopy

[57] ABSTRACT

A radio receiver has a receiver section (103) that receives an information signal and an integrated circuit (105) in which a default operating condition of an electronic device is selectively programmed. A mask option programming link in the integrated circuit (105) is programmed while maintaining electrical isolation of a programming bias from the electronic device (207). The mask option programming link has a first conductor (211) in a first layer with first (212) and second (213) programming contact terminals. A second conductor (210) that determines a default operating condition of the electronic device (207), resides in a second layer that is electrically isolated from the first layer. When sufficient programming bias is applied to the programming terminals of the first conductor (211), energy dissipated by the first conductor eliminates coupling of the second conductor (210) to the electronic device (207), changing its default operating condition.

14 Claims, 3 Drawing Sheets

ELECTRICALLY ISOLATED METAL MASK PROGRAMMING USING A POLYSILICON FUSE

FIELD OF THE INVENTION

This invention relates in general to metal mask option programming for the selection of options in an electronic device and more particularly to metal mask option programming for the selection of options in a selective call radio receiver.

BACKGROUND OF THE INVENTION

Radio communication systems typically use a receiver (e.g., a selective call receiver or "pager") that has at least one unique call address associated therewith. These radios receive and decode at least one specific address, then typically alert the user to the presence of incoming information and operate to present this information. Radio communication systems are an excellent vehicle for delivering voice, numeric, alphanumeric or coded information to a user.

In contemporary selective call receivers, selective call addresses and operating features are selected by an integrated circuit controller (e.g., a microprocessor or the like) that reads information from a non-volatile memory such as a code plug. The same basic integrated circuit controller may be used in a number of selective call receiver models ranging from a basic low tier model (e.g., tone only alerting) to a full featured high tier model (e.g., alphanumeric display and voice messaging). In the past, to establish tiering among these models, a common base integrated circuit layout was designed with a plurality of unique, optional metal mask layers, each representing different levels of functionality (e.g., more or less options). More modern configuration methods use the same basic layout with either zener diode (electrically severed) or laser trimmable programming or trim links. The links are initially continuous and are selectively severed, depending on the requirements of the integrated circuit.

With integration of the programming links comes a new problem. In order to sever these links, one must use either a high power, extremely accurate laser, or apply a high voltage bias across a selected link, thereby melting the link. Because of a large beam spot size in relation to the absolute device size and geometry in state of the art integrated circuits, laser trimming has become impractical. Electrically programming links using zener trims also has problems. Since the programing links are electrically connected to their respective circuits, there is no way to prevent the trim bias from being applied to the active and passive devices comprising the integrated circuitry. This imposes an undesirable and sometimes impossible design constraint in that the breakdown potentials of the devices interconnected to the links must exceed by a significant amount, the trim bias potential applied thereto. If this constraint is not met, damage or destruction of the circuitry will occur.

Consequently, what is needed is an apparatus for electrically programming metal mask options that will provide sufficient isolation of the programming bias potential from the integrated circuitry, thereby preventing any damage to the circuit devices.

SUMMARY OF THE INVENTION

Briefly, according to the invention, there is provided a radio receiver having a receiver section that receives an information signal and an integrated circuit in which a default operating condition of an electronic device is selectively programmed. A mask option programming link in the integrated circuit is programmed while maintaining electrical isolation of a programming bias from the electronic device. The mask option programming link has a first conductor in a first layer, the first conductor having first and second programming contact terminals; and a second conductor coupled to the electronic device for determining a default operating condition. The second conductor resides in a second layer that is electrically isolated from the first layer. When sufficient programming bias is applied to the first and second programming terminals of the first conductor, energy dissipated by the first conductor eliminates coupling of the second conductor to the electronic device and changes its default operating condition.

DESCRIPTION OF A PREFERRED EMBODIMENT

Figure 1:
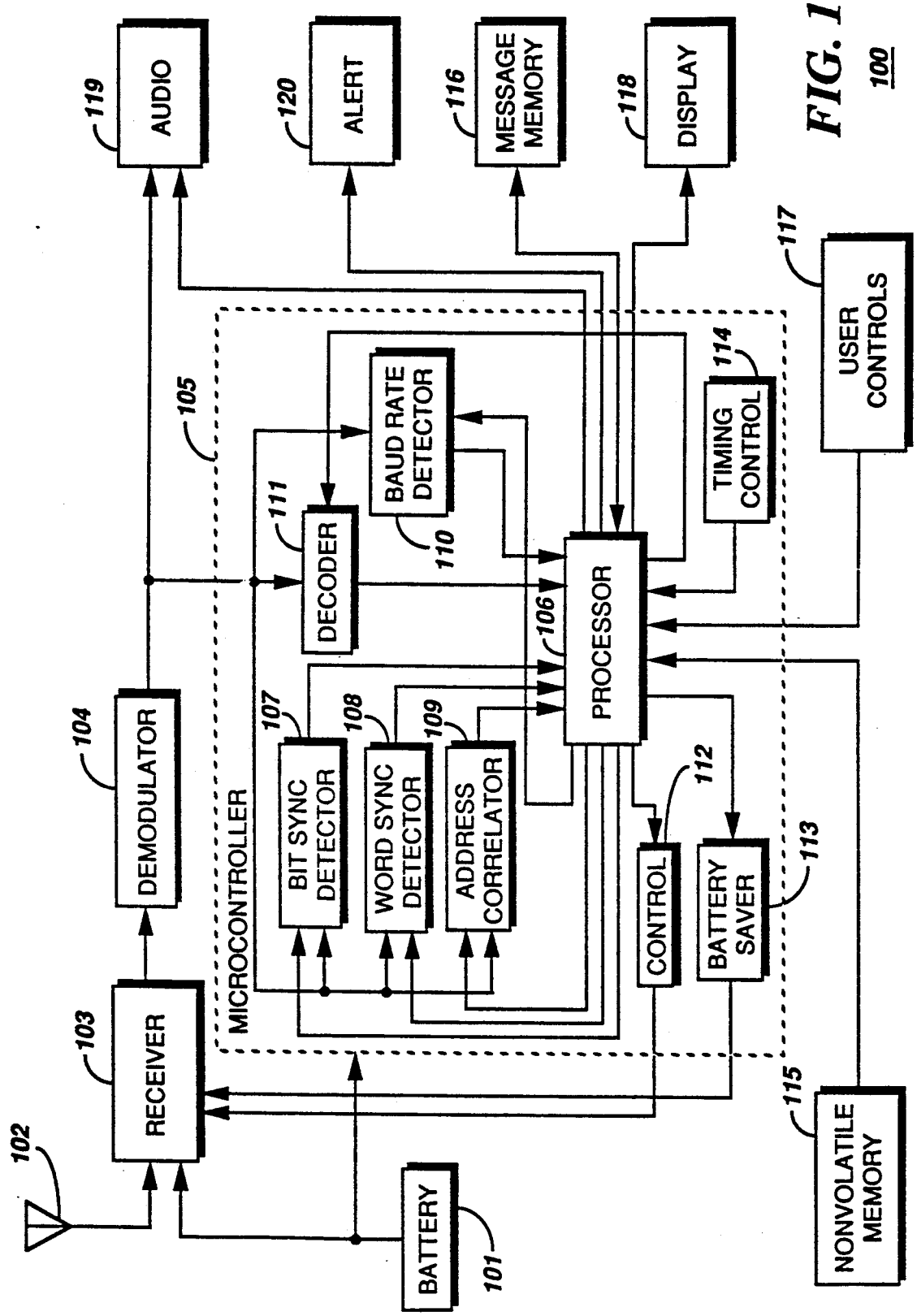
FIG. 1 is a block diagram of a selective call receiver capable of embodying a metal mask programmable integrated circuit in accordance with the present invention.

Referring to FIG. 1, a battery 101 powered selective call receiver 100 operates to receive a signal via an antenna 102. A receiver 103 couples the received signal to a conventional demodulator 104 that is capable of recovering analog or digital information. Received digital information is recovered as a serial bit stream that is then coupled to a micro-controller 105 for interpreting and decoding the serial bit stream as address, control, and data signals. In the preferred embodiment, the micro-controller 105 may comprise a processor 106, a bit synchronization detector 107, a word synchronization detector 108, an address correlator 109, a baud rate detector 110, a data decoder 111, a control circuit 112, a battery saver 113, and a timing control 114, implemented in hardware, software, or a combination thereof. Examples of commercially available microcontrollers suitable for implementing the preferred embodiment of the present invention are Motorola's MC68HC05xx or M68HC11xx. Complete descriptions of these devices are available in Motorola's data book set entitled "Microprocessor, Microcontroller, and Peripheral Data," volumes I and II, Series A, © 1988 by MOTOROLA, INC.

More specifically, in the micro-controller 105 the serial bit stream is coupled to the baud rate detector 110 that determines a receiving data rate associated with the recovered information. When the receiving data rate is determined, the bit synchronization detector 107 establishes synchronization between the micro-controller's 105 data decoding components (106, 109, and 111) and the individual signals (e.g., address, control, and data signals) in the recovered information. Once bit synchronization is established, the word synchronization detector 108 searches the serial bit stream for information indicating the beginning of a batch or frame. When the micro-controller 105 has established both bit and word synchronization, the recovered information is searched for a group identification code associated with the selective call receiver. When the selective call receiver's group identification code is found, the receiver will search only those code frames associated with the receiver's group for pages intended for the selective call receiver. During the period between like frames, the micro-controller 105 will "shut-down" the receiver 103 and demodulator 104, thereby conserving battery power. The predetermined interval between like frames is known in the art as a "sleep" period. Since the system protocol is designed such that pages targeted for a specific group identifier, of which each selective call receiver is a member of at least one group, are sent only during the transmission of that group, no pages are missed during the sleep period. A receiver that operates in the fashion discussed above is said to be operating in a "battery saving" mode.

In determining the selection of a particular selective call receiver, a correlation is performed between a predetermined address associated with the selective call receiver and a received address. To accomplish this, the address correlator 109, which comprises a signal processor, correlates a recovered address with the predetermined address or addresses stored in the selective call receiver's non-volatile memory 115 or code plug. Optionally, the non-volatile memory 115 may reside inside a support integrated circuit (not shown) or in the micro controller 105. The non-volatile memory 115 typically has a plurality of registers for storing a plurality of configuration words that characterize the operation of the selective call receiver. When the addresses correlate, the micro-controller 105 may in a tone-only mode activate an alert 120. Alternatively, if a data (numeric or alphanumeric) address is received, the decoder 111 couples message information to the message memory 116.

In accordance with the recovered information, and settings associated with the user controls 117, the selective call receiver presents at least a portion of the message information, such as by a display 118 or an audio section 119, and signals the user via an audible, visual, or tactile alert 120 that a message has been received. The user may view information that is automatically presented on the display 118 or manually presented in response to activating the appropriate user controls 117.

Figure 2:
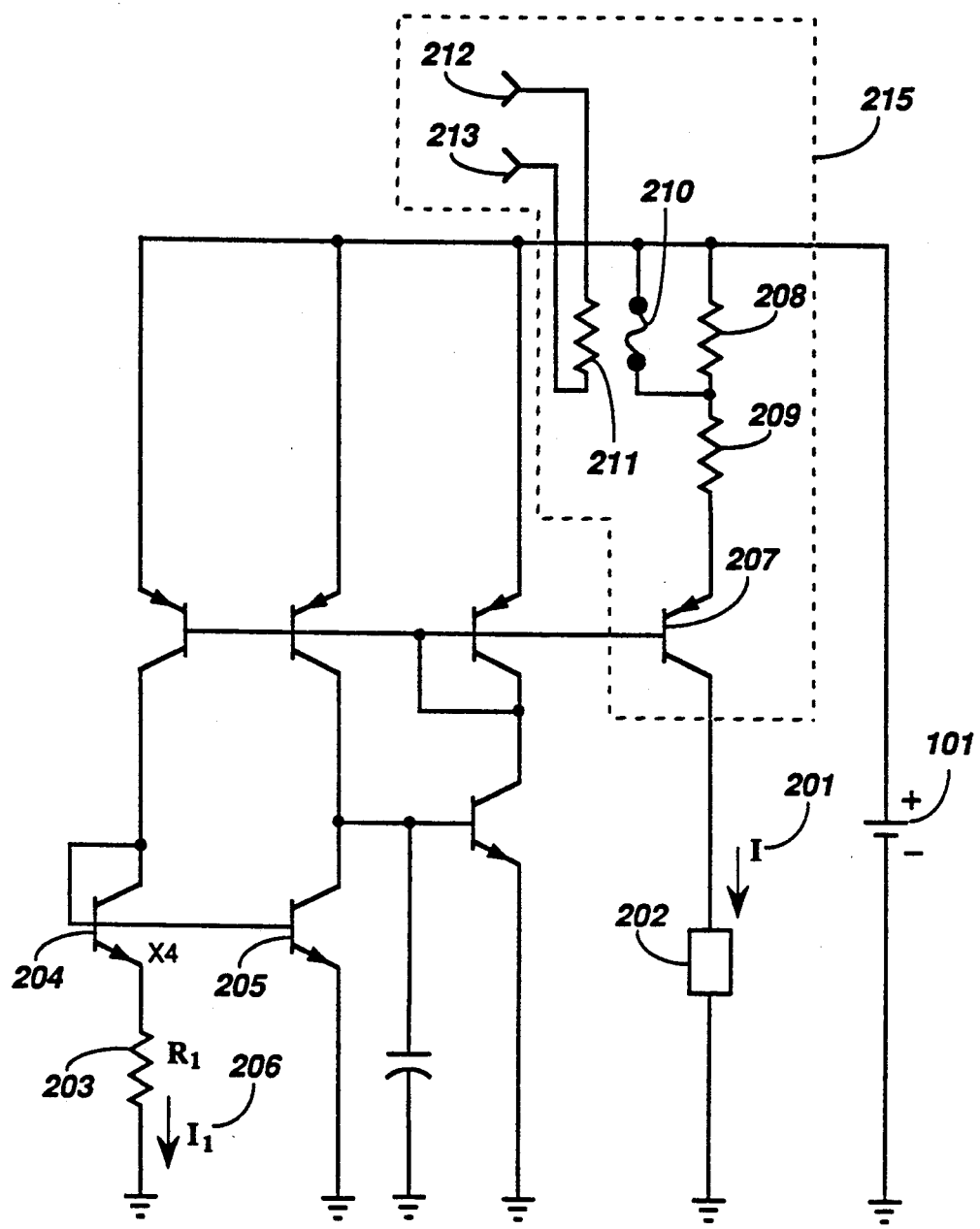
FIG. 2 is a schematic diagram showing an exemplary circuit topology that utilizes a selectively programmed conductive mask option in accordance with the present invention.
Figure 3:
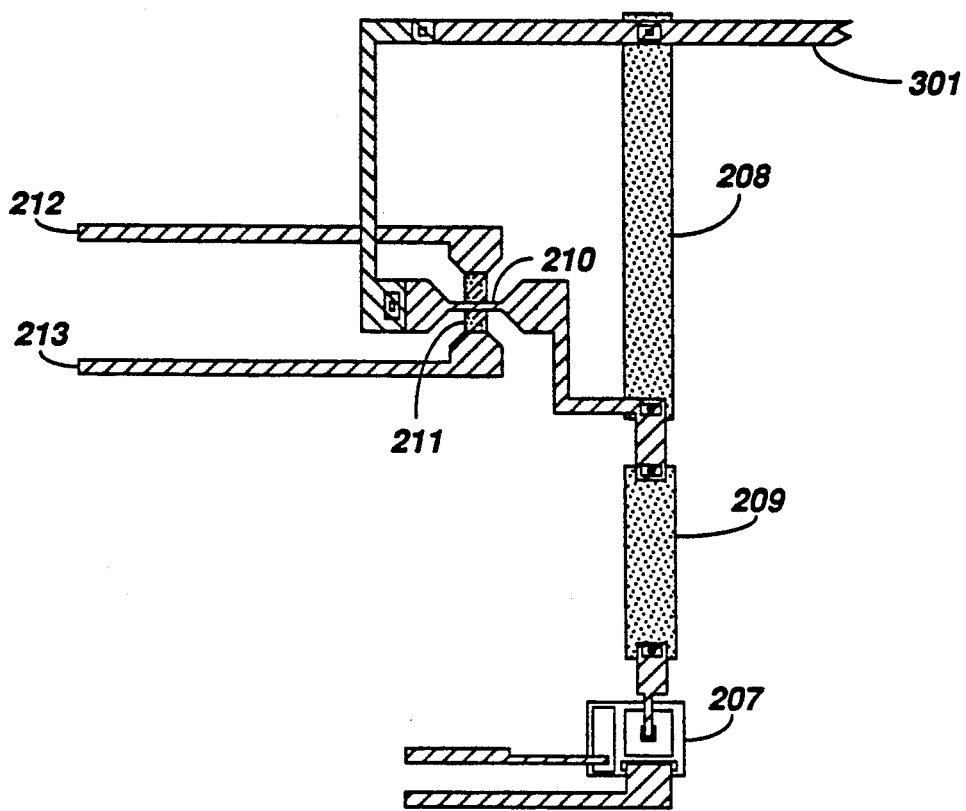
FIG. 3 illustrates an apparatus for selectively programming a conductive mask option in an integrated circuit while maintaining electrical isolation of a programming bias from at least one electronic device in the integrated circuit.

The micro-controller 105 may also include items such as a conventional signal multiplexer, a voltage regulator and control mechanism, a current regulator and control mechanism, environmental sensing circuitry such as for light or temperature conditions, audio power amplifier circuitry, control interface circuitry, and display illumination circuitry. These elements are arranged in a known manner to provide an information receiver as requested by a customer. Additionally, the micro-controller 105 may contain a metal mask programmable option strap as shown in FIGS. 2 and 3, that selectively configure items such as the current regulator, voltage regulator, environmental sensing circuitry, or control interface circuitry. This allows the customization of the support circuit specific to the intended application.

Referring to FIG. 2, the schematic diagram showing an exemplary circuit topology that utilizes a selectively programmed conductive mask option in accordance with the present invention. The topology chosen for this example is a low-voltage band-gap current source reference circuit such as might be used on an integrated circuit in the selective call receiver of FIG. 1. This current source reference circuit functions to provide a stable bias current for other circuits (e.g., amplifiers or digital logic) on the integrated circuit. Operationally, the circuit shown in FIG. 2 generates an output bias current I 201 by generating a first reference current $I_1$ 206 through resistor 203. For large transistor beta (current gain), the first reference current $I_1$ 206 and the emitter currents of transistor 204 and transistor 205 are approximately equal to I 201. Bipolar transistor 204 has an emitter area that is four times the size of the emitter area of bipolar transistor 205. The difference in areas and equal emitter currents results in a $\Delta V_{BE}$ (base-emitter voltage difference) of approximately 36 millivolts at 300° K. Because the bases of transistors 204 and 205 are tied together, and the base-emitter voltage of transistor 205 is approximately 36 millivolts higher than the base-emitter voltage of transistor 204, the first reference current $I_1$ 206 generated is equal to the $\Delta V_{BE}$ (which is the voltage across resistor 203) divided by the value of resistor 203. By example, if a 10 μA current reference is desired, resistor 203 would be chosen to be 3600 Ω. With resistor 203 set at 3600 Ω, the output bias current I 201 of 10 μA is supplied to the load impedance (e.g., an amplifier, a digital logic circuit, etc.) 202 via a current mirroring transistor 207 that repeats the first reference current $I_1$ 206 of 10 μA.

In this embodiment, a value of resistor 208 is chosen such that when placed in series with resistor 209, the voltage drop across the pair is sufficient to cut-off transistor 207, thereby delivering no current to the load circuit 202. Therefore, when a conductive mask option programming link 210 is continuous, the battery 101 voltage is applied via link 210 to resistor 209, resulting in enablement of transistor 207, and delivery of the output bias current I 201 to the load 202. When the link 210 has been severed, the battery 101 voltage is applied via resistor 208 to resistor 209, resulting in a series voltage drop sufficient to cut-off transistor 207 and deliver no significant output bias current I 201 to the load 202. The illustration further shows a first conductor (e.g., a polysilicon fuse represented as a resistor) 211 having first and second programming contact terminals for application of a programming bias. The exemplary selection circuit 215 comprising the elements within the dotted box is shown in integrated circuit layout form in the following figure.

Referring to FIG. 3, the illustration shows an apparatus for selectively programming a conductive mask option in an integrated circuit while maintaining electrical isolation of a programming bias from at least one electronic device in the integrated circuit. The devices represented in this illustration are shown schematically in FIG. 2. and are fabricated using conventional integrated circuit processes that are well known in the art. Runner 301 is coupled to the battery 101 as shown in FIGS. 1 and 2, thus providing operating power for the circuit.

Referring to the structure of the polysilicon fuse, a first conductor 211 residing in a first layer has first 212 and second 213 programming contact terminals. In close proximity to the first conductor 211, a second conductor 210 such as aluminum is coupled to an electronic device (e.g., resistors 208, 209, transistor 207, etc.) for determining a default operating condition associated therewith. The first 211 and second 210 conductors in this embodiment are electrically isolated by a conventional layer of oxide.

Transistor 207 operates to source current to the load 202 in the default operating condition. The second conductor (e.g., the conductive mask option programming link) 210, resides in a second layer that is electrically isolated from the first layer by the oxide layer. When sufficient programming bias is applied to the first 212 and second 213 programming contact terminals of the first conductor 211, energy dissipated by the first conductor 211 eliminates the coupling to the electronic device (e.g., severs the second conductor or conductive mask option programming link 210), thereby changing the default operating condition. This method when applied to the apparatus shown in FIG. 3 prevents any of the programming bias from being applied to the integrated electronic devices (e.g., resistors 208, 209, transistor 207, etc.), thereby protecting them from damage. In prior art metal mask programming systems, a designer would position a programming link such as a zener diode in the position where the conductive mask option programming link 210 is located. To trim a prior art diode programming link, the programming bias needed to be directly applied across the diode until total junction breakdown occurred. This method worked nicely unless there was a lower resistance path to ground (e.g., the reference programming potential) through a device coupled to the zener trim element. In this case, the device coupled to the zener trim element would be damaged or destroyed instead of (or in addition to) the zener trim element. These problems are further magnified if a non-isolated metal programming link was used for selection.

In the preferred embodiment, the first conductor 211 comprises a polysilicon resistor having a bulk resistance that is greater that the bulk resistance associated with the second conductor 210. One of ordinary skill in the art will appreciate that the resistivity of the first 211 and second conductors 210 may vary depending on at least the integrated circuit process and material choice. Materials other than those mentioned may be used to implement the instant invention, yielding nearly the same results. One could easily substitute a different semiconductor material for the polysilicon or a different metal for the aluminum.

Further in reference to FIG. 2, when the second conductor (e.g., the conductive mask option programming link) 210 is eliminated, the battery 101 voltage applied via resistor 208 to resistor 209 results in a series voltage drop sufficient to cut-off transistor 207. This prevents any output bias current I 201 from being delivered to the load 202. The mechanism described can be used to effectively control the activation of a digital or analog circuit or possibly an operating region (in the case of a conventional ladder trim network) of a circuit.

The exemplary circuit shown in FIGS. 2 and 3 represents only one of many possible applications of the present invention. Polysilicon activated metal mask fuses or programming links may also be used to implement a factory programmed digital identification code, a linear (or non-linear) operating point trim network, or possibly even a temporary radio frequency shorting network used in the alignment of a synchronously tuned filter network.

We claim:

1. A radio receiver, comprising:
a receiver that receives an information signal; an integrated circuit having a programmed operating condition, the integrated circuit being responsive to the received information signal to provide a selective call messaging capability; and
a mask option programming link that selects the programmed operating condition of an electronic device in the integrated circuit, the mask option programming link comprising:
a first conductor residing on a first layer, the first conductor having first and second programming contact terminals; and
a second conductor coupled to and determining the programmed operating condition of the electronic device, the second conductor residing on a second layer that is electrically isolated from the first layer, the operating condition of the electronic device being programmed when sufficient programming bias is applied to the first and second programming contact terminals of the first conductor, causing energy to be dissipated by the first conductor and coupled to the second conductor, resulting in elimination of the second conductor coupling to the electronic device.

2. The radio receiver according to claim 1 wherein the integrated circuit processes the information signal, recovering a serial bit stream therefrom comprising at least an address signal, and in response to the address signal, provides the selective call messaging capability.

3. The radio receiver according to claim 1 wherein the first conductor has a first resistivity greater than a second resistivity associated with the second conductor.

4. The radio receiver according to claim 1 wherein the second conductor has a second resistivity greater than a first resistivity associated with the first conductor.

5. The radio receiver according to claim 1 wherein the first and second conductors have substantially equal resistivities.

6. The radio receiver according to claim 1 wherein the first conductor is a polysilicon material.

7. The radio receiver according to claim 1 wherein the second conductor is aluminum.

8. The radio receiver according to claim 1 wherein the first conductor is a semiconductor material.

9. The radio receiver according to claim 1 wherein the second conductor is a metal.

10. An integrated circuit in which a default operating condition of an electronic device is selectively programmed, the integrated circuit comprising:
a mask option programming link that determines the operating condition of the electronic device, the mask option programming link comprising:
a first conductor residing on a first layer, the first conductor having first and second programming contact terminals; and
a second conductor coupled to the electronic device for determining the operating condition associated therewith, the second conductor residing on a second layer that is electrically isolated from the first layer, and when sufficient programming bias is applied to the first and second programming contact terminals of the first conductor, energy dissipated by the first conductor eliminates the second conductor coupling to the electronic device, thereby changing the operating condition associated therewith.

11. The integrated circuit according to claim 10 wherein the first conductor has a first resistivity greater than a second resistivity associated with the second conductor.

12. The integrated circuit according to claim 10 wherein the first conductor is a polysilicon material.

13. The integrated circuit according to claim 10 wherein the second conductor is aluminum.

14. A radio receiver, comprising:

a receiver that receives an information signal;

an integrated circuit having a programmed operating condition, the integrated circuit recovering a serial bit stream from the information signal, the serial bit stream comprising at least an address signal, and in response to correlation of the address signal with a predetermined address, providing selective call messaging capability; and a mask option programming link that selects the programmed operating condition of an electronic device in the integrated circuit, the mask option programming link comprising:

a polysilicon conductor having a first resistivity and residing on a first layer, the polysilicon conductor having first and second programming contact terminals; and an aluminum conductor residing on a second layer that is electrically isolated from the first layer and coupled to the electronic device for determining the programmed operating condition, the programmed operating condition being programmed when sufficient programming bias is applied to the first and second programming contact terminals of the polysilicon conductor causing energy to be dissipated by the polysilicon conductor and coupled to the aluminum conductor to result in elimination of the aluminum conductor coupling to the electronic device.

* * * * *